(12) United States Patent
Hatakeyama (10) Patent No.: US 7,427,464 B2
(45) Date of Patent: Sep. 23, 2008

(54) PATTERNING PROCESS AND UNDERCOAT-FORMING MATERIAL

(75) Inventor: Jun Hatakeyama, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 695 days.

(21) Appl. No.: 10/872,562

(22) Filed: Jun. 22, 2004

(65) Prior Publication Data

US 2005/0282091 A1 Dec. 22, 2005

(51) Int. Cl.
G03F 7/00 (2006.01)
G03F 7/36 (2006.01)

(52) U.S. Cl. .................................. 430/270.1; 430/311
(58) Field of Classification Search .............. 430/270.1, 430/396, 313; 428/447; 427/387; 525/314, 525/534

See application file for complete search history.

(56) References Cited

U.S. PATENT DOCUMENTS

| | | | | |
|---|---|---|---|---|
| 5,294,680 A | 3/1994 | Knors et al. | ............. | 525/327.4 |
| 5,525,457 A | 6/1996 | Nemoto et al. | ............. | 430/325 |
| 5,756,255 A | 5/1998 | Sato et al. | ................ | 430/270.1 |
| 5,783,639 A * | 7/1998 | Kataoka et al. | ............. | 525/286 |
| 5,851,730 A | 12/1998 | Thackeray et al. | ........ | 430/271.1 |
| 6,013,407 A | 1/2000 | Kawata et al. | ............. | 430/191 |
| 6,316,165 B1 | 11/2001 | Pavelchek et al. | ........... | 430/311 |
| 2002/0086934 A1 | 7/2002 | Kawaguchi et al. | ......... | 524/544 |
| 2004/0241577 A1 * | 12/2004 | Hatakeyama et al. | .... | 430/270.1 |

FOREIGN PATENT DOCUMENTS

| | | |
|---|---|---|
| JP | 6-80760 A | 3/1994 |
| JP | 6-118651 A | 4/1994 |
| JP | 6-202317 A | 7/1994 |
| JP | 7-5302 A | 1/1995 |
| JP | 7-69611 B2 | 7/1995 |
| JP | 07258385 A * | 10/1995 |
| JP | 8-179502 A | 7/1996 |
| JP | 8-179509 A | 7/1996 |
| JP | 8-220750 A | 8/1996 |
| JP | 8-292565 A | 11/1996 |
| JP | 9-15855 A | 1/1997 |

(Continued)

OTHER PUBLICATIONS

Brunsvold et al. "Evaluation of a deep bilayer resist for sub-half micron lithography". SPIE vol. 1925, 1993, 377-387.

(Continued)

*Primary Examiner*—Cynthia H. Kelly
*Assistant Examiner*—Ponder N Thompson Rummel
(74) *Attorney, Agent, or Firm*—Birch, Stewart, Kolasch & Birch, LLP (57) ABSTRACT

A pattern is formed by applying an undercoat layer comprising a naphthol-dicyclopentadiene copolycondensate on a processable substrate as an antireflective film, applying a photoresist layer over the undercoat layer, exposing the photoresist layer to radiation, developing the resist with a developer to form a resist pattern, and dry etching the undercoat layer and the substrate through the photoresist layer as a mask. The undercoat layer has an optimum refractive index to provide a satisfactory antireflection effect at a film thickness of 200 nm or greater as well as high etching resistance. The shape of resist after patterning remains satisfactory.

5 Claims, 3 Drawing Sheets

FOREIGN PATENT DOCUMENTS

| | | | |
|---|---|---|---|
| JP | 9-110938 A | 4/1997 |
| JP | 10-69072 A | 3/1998 |
| JP | 10-282666 A | 10/1998 |
| JP | 10-324748 A | 12/1998 |
| JP | 2953562 B2 | 7/1999 |
| JP | 11-302382 A | 11/1999 |
| JP | 2000010286 A | * | 1/2000 |
| JP | 3050459 B2 | 3/2000 |
| JP | 3082473 B2 | 6/2000 |
| JP | 2000-294504 A | 10/2000 |
| JP | 2001-40293 A | 2/2001 |
| JP | 2002-14474 A | 1/2002 |
| JP | 2002-55456 A | 2/2002 |
| JP | 2002-214777 A | 7/2002 |

OTHER PUBLICATIONS

Hatakeyama et al. "Investigation of discrimination enhancement in polysilsesquioxane based positive resist for ArF lithography". SPIE vol. 3333, 1998, 62-72.

Schaedeli et al. "Evaluation of materials for 193-nm lithography". Journal of Photopolymer Science and Technology, vol. 9, No. 3, 1996, 435-446.

Kwong et al. "IBM 193nm bilayer resist: Materials, lithographic performance and optimization", SPIE vol. 4345, 2001, 50-57.

* cited by examiner

PATTERNING PROCESS AND UNDERCOAT-FORMING MATERIAL

This invention relates to an undercoat-forming material useful as an antireflective film material used for micropatterning in a process for the fabrication of semiconductor devices or the like, and a resist pattern-forming process adapted for exposure to ArF excimer laser light (193 nm), $F_2$ laser light (157 nm), $Kr_2$ laser light (146 nm) and $Ar_2$ laser light (126 nm) using the same.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 µm or less), a shorter wavelength light source is required, and in particular, photolithography using ArF excimer laser light (193 nm) is now under investigation.

On the other hand, it is known in the art that the bilayer resist method is advantageous in forming a high-aspect ratio pattern on a stepped substrate. In order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). For ArF laser exposure, positive resist compositions comprising as a base a silsesquioxane of the type in which cyclohexylcarboxylic acid is substituted with an acid labile group were proposed (see JP-A 10-324748, JP-A 11-302382, and SPIE vol. 3333-07 (1998), p. 62). For $F_2$ laser exposure, positive resist compositions comprising a silsesquioxane having hexafluoroisopropanol as a dissolvable group as a base were proposed (see JP-A 2002-55456). The above polymer bears in its backbone a polysilsesquioxane containing a ladder skeleton produced through polycondensation of a trialkoxysilane or trihalosilane.

Silicon-containing (meth)acrylate polymers were proposed as a resist base polymer having silicon pendants on side chains (see JP-A 9-110938, J. Photopolymer Sci. and Technol., Vol. 9, No. 3 (1996), pp. 435-446).

The undercoat layer of the bilayer resist process is formed of a hydrocarbon compound which can be etched with oxygen gas, and must have high etching resistance since it serves as a mask when the underlying substrate is to be etched. For oxygen gas etching, the undercoat layer must be formed solely of a silicon atom-free hydrocarbon. To improve the line-width controllability of the upper layer of silicon-containing resist and to minimize the sidewall corrugation and collapse of the pattern by standing waves, the undercoat layer must have the function of an antireflective film. Specifically, the reflectivity from the undercoat layer back into the resist film must be reduced to below 1%.

Figure 1:
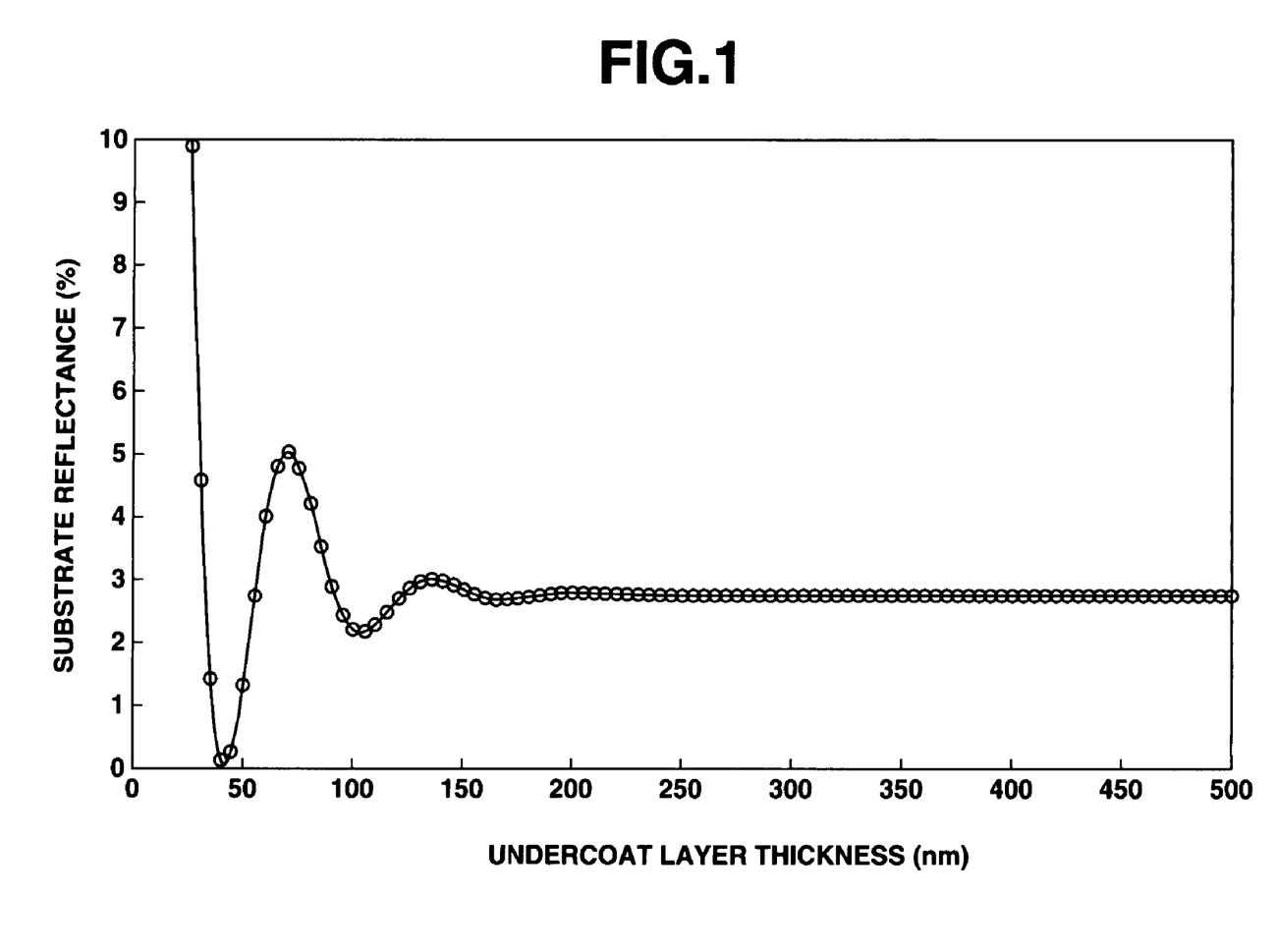
FIG. 1 is a graph plotting the substrate reflectivity versus the thickness of an undercoat layer.

In the case of a subbing antireflective film used in the monolayer resist process, when a high reflection substrate such as polysilicon or aluminum underlies, a material having an optimum refractive index (n value) and absorption coefficient (k value) is designed to an appropriate film thickness, whereby the reflectivity from the substrate can be reduced to below 1%, achieving a significant antireflection effect. In an example wherein the wavelength is 193 nm and a resist has a refractive index of 1.7, if the subbing antireflective film has a refractive index (real part of complex refractive index) n of 1.5, an extinction coefficient (imaginary part of complex refractive index) k of 0.5, and a thickness of 42 nm, then the reflectivity becomes below 0.5% (see FIG. 1). However, if the substrate has steps, the antireflective film largely varies its thickness at the steps. The antireflection effect of the subbing film utilizes not only the absorption of light, but also the interference effect arising from a properly designed film thickness. The first base of 40 to 45 nm having the enhanced interference effect has an accordingly enhanced antireflection effect, but the reflectivity largely varies with a change of film thickness. JP-A 10-69072 discloses a high conformity antireflective film-forming material in which the molecular weight of a base resin is increased to minimize the variation of film thickness at steps. As the molecular weight of a base resin increases, there arise problems that more pinholes generate after spin coating, filtration becomes difficult, a viscosity change with the passage of time leads to a variation of film thickness, and crystals precipitate at the nozzle tip. The conformal behavior is developed only at relatively low steps.

In another method using a film thickness of at least the third base (i.e., at least 170 nm) where the variation of reflectivity due to a film thickness variation is relatively small, the variation of reflectivity due to a film thickness variation is small and the reflectivity is kept below 1.5% as long as the k value is in a range of 0.2 to 0.3 and the film thickness is at least 170 nm. However, when the etching load that the overlying resist layer has to bear is considered, the approach of thickening the antireflective film encounters a limit, the limit of film thickening being of the order of the second base of up to 100 nm.

In the event the underlay below the antireflective film is a transparent film like an oxide or nitride film and steps exist below that transparent film, the thickness of the transparent film varies even if the surface of the transparent film is planarized as by chemical mechanical polishing (CMP). In this event, it is possible to make the thickness of the overlying antireflective film uniform. If the thickness of a transparent film underlying the antireflective film varies, the thickness of the minimum reflective film is shifted by the thickness of the transparent film. Even if the thickness of the antireflective film is set equal to the thickness of the minimum reflective film when the underlay is a reflective film, the reflectivity can be increased due to a variation of the thickness of the transparent film.

The materials of which the antireflective film is made are generally divided into inorganic and organic materials. A typical inorganic material is a SiON film. This has the advantages that it can be formed by CVD of a gas mixture of silane and ammonia, and the etching load on resist is light due to a high selective ratio of etching relative to resist, but the range of application is restricted because of difficulty of peeling. Because of a nitrogen atom-containing basic film, another drawback arises that it is susceptible to footing in the case of positive resist and an undercut profile in the case of negative resist.

The organic material has the advantages that spin coating is possible without a need for a special equipment as needed for CVD and sputtering, peeling is possible like resist, no footing occurs, the shape is obedient, and adhesion to resist is good. Thus a number of antireflective films based on organic materials have been proposed. For example, JP-B 7-69611 describes a composition comprising a condensate of a diphenylamine derivative with a formaldehyde-modified melamine resin, an alkali-soluble resin, and a light-absorbing agent; U.S. Pat. No. 5,294,680 describes the reaction product of a maleic anhydride copolymer with a diamine light-absorbing agent; JP-A 6-118631 describes a composition comprising a resin binder and a methylol melamine type heat crosslinking agent; JP-A 6-118656 describes a composition based on an acrylic resin having a carboxylic group, an epoxy group and a light-absorbing group within a common molecule; JP-A 8-87115 describes a composition comprising a methylol melamine and a benzophenone light-absorbing agent; and JP-A 8-179509 describes a polyvinyl alcohol resin with a low molecular weight light-absorbing agent added thereto. In all these patents, a light-absorbing agent is either added to a binder polymer or introduced into a polymer as substituent groups. However, since most light-absorbing agents have aromatic groups or double bonds, the addition of a light-absorbing agent undesirably increases dry etching resistance and rather reduces a selective ratio of dry etching relative to the resist. As the feature size becomes finer, the drive toward resist film slimming is accelerated. In the ArF exposure lithography of the next generation, acrylic or alicyclic polymers are used as the resist material, indicating that the etching resistance of the resist becomes poor. A further consideration is the problem that the thickness of antireflective film must be increased as mentioned above. Then, etching is an acute problem. There is a need for an antireflective film having a high selective ratio of etching relative to resist, that is, a high etching speed.

The function required as an antireflective film for the undercoat layer of the bilayer resist process differs from the function required in the monolayer resist process. Since the undercoat layer of the bilayer resist process serves as a mask when the substrate is etched, it must have a high etching resistance under the substrate etching conditions. As opposed to the antireflective film in the monolayer resist process required to have a high etching speed in order to mitigate the load to the monolayer resist, the inverse performance is required. To provide sufficient substrate etching resistance, the thickness of the undercoat layer must be equal to or greater than the monolayer resist, that is, as thick as 300 nm or greater. At a film thickness of at least 300 nm, the variation of reflectivity due to a film thickness change is substantially converged so that the antireflection effect due to phase difference control is no longer expected.

Figure 2:
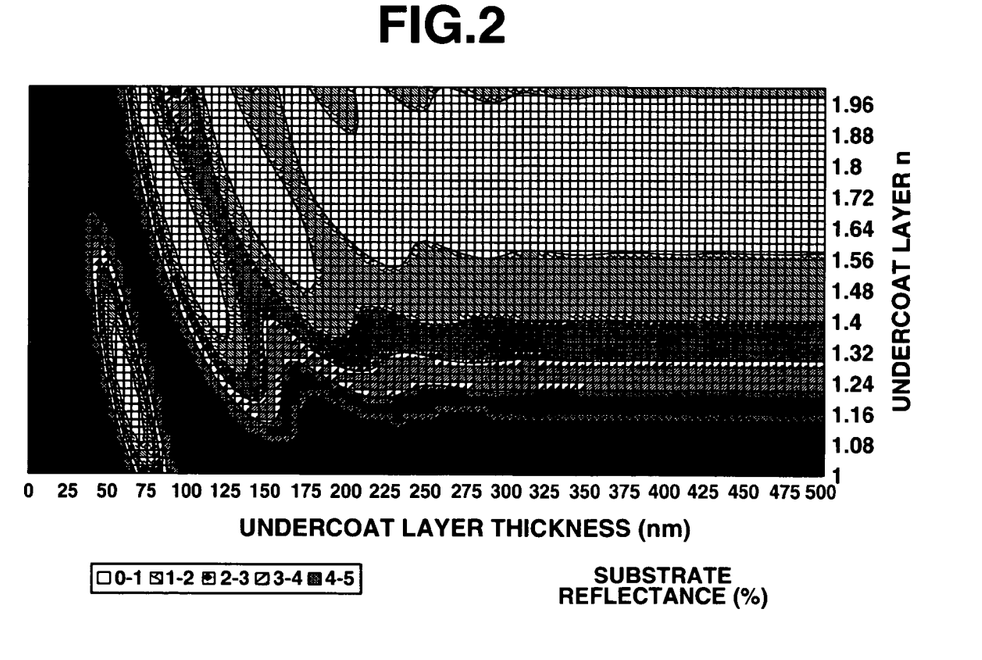
FIG. 2 is a graph plotting the reflectivity versus undercoat layer thickness when the k value of the undercoat layer is fixed at 0.3 and the n value varies from 1.0 to 2.0.
Figure 3:
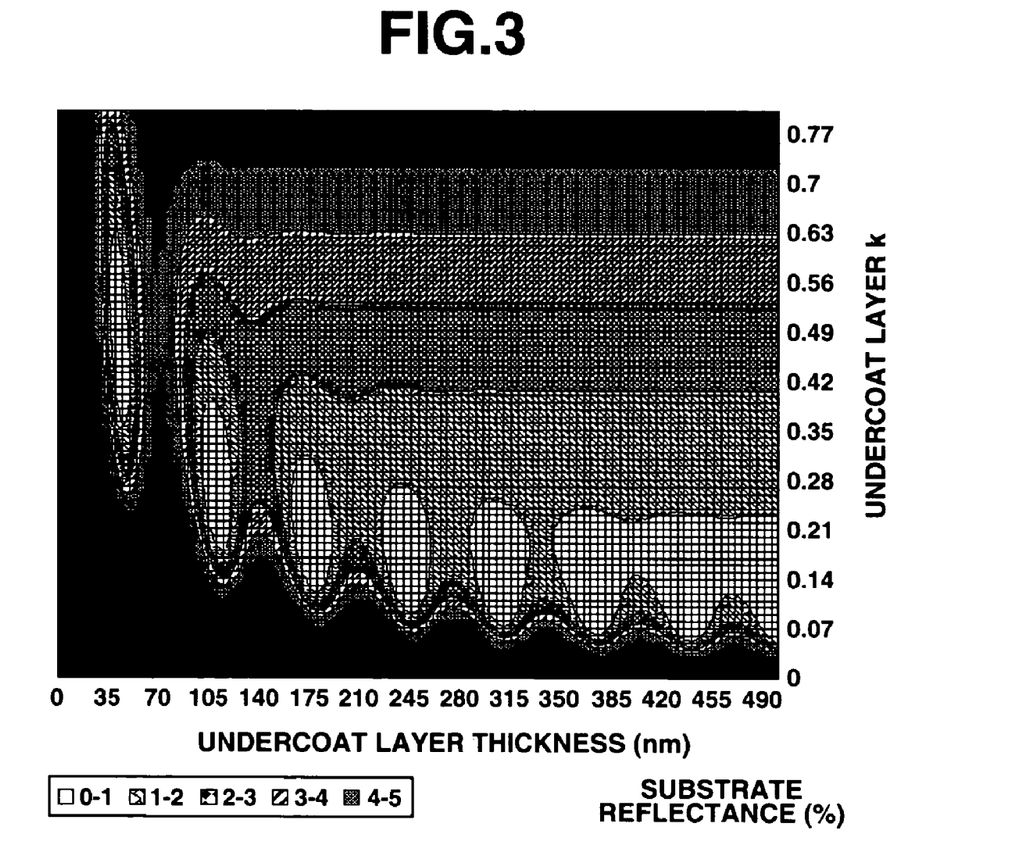
FIG. 3 is a graph plotting the reflectivity versus undercoat layer thickness when the n value of the undercoat layer is fixed at 1.5 and the k value varies from 0.1 to 1.0.

Now, the results of calculation of reflectivity at varying film thicknesses up to the maximum thickness of 500 nm are shown in FIGS. 2 and 3. Assume that the exposure wavelength is 193 nm, and the upper layer resist has an n value of 1.74 and a k value of 0.02. FIG. 2 shows substrate reflectivity when the k value of the undercoat layer is fixed at 0.3, the n value varies from 1.0 to 2.0 on the ordinate and the film thickness varies from 0 to 500 nm on the abscissa. In an imaginary case wherein the undercoat layer of the bilayer resist process has a thickness of 300 nm or greater, optimum values at which the reflectivity is reduced to or below 1% exist in the refractive index range of 1.6 to 1.9 which is approximate to or higher than that of the upper layer resist.

FIG. 3 shows substrate reflectivity when the n value of the undercoat layer is fixed at 1.5 and the k value varies from 0.1 to 0.8. In the k value range of 0.24 to 0.15, the reflectivity can be reduced to or below 1%. By contrast, the antireflective film in the form of a thin film of about 40 nm used in the monolayer resist process has an optimum k value in the range of 0.4 to 0.5, which differs from the optimum k value of the undercoat layer in the bilayer resist process having a thickness of 300 nm or greater. For the undercoat layer in the bilayer resist process, an undercoat film having a lower k value, that is, more transparent is necessary.

As the material for forming an undercoat layer for 193 nm exposure, copolymers of polyhydroxystyrene with acrylic compounds are under study as described in SPIE vol. 4345, p. 50 (2001). Polyhydroxystyrene has a very strong absorption at 193 nm and its k value is as high as around 0.6 by itself. By copolymerizing with an acrylic compound having a k value of almost 0, the k value is adjusted to around 0.25.

However, the resistance of an acrylic compound to substrate etching is weak as compared with polyhydroxystyrene, and a considerable proportion of the acrylic compound must be copolymerized in order to reduce the k value. As a result, the resistance to substrate etching is considerably reduced. The etching resistance is not only reflected by the etching speed, but also evidenced by the development of surface roughness after etching. Through copolymerization of acrylic compound, the surface roughness after etching is increased to a level of significance.

Naphthalene ring is one of rings that have a more transparency at 193 nm and a higher etching resistance than benzene ring. JP-A 2002-14474 proposes an undercoat layer having a naphthalene or anthracene ring. However, since naphthol-copolycondensed novolac resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolac resin and polyvinyl naphthalene resin have low n values at 193 nm, as evidenced by a value of 1.4 for the naphthol-copolycondensed novolac resin and a value of only 1.2 for the polyvinyl naphthalene resin as long as the inventors measured. JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

JP-A 6-202317, JP-A 8-179502, JP-A 8-220750, JP-A 8-292565, and JP-A 9-15855 disclose i-line resists comprising a copolycondensed polymer of cresol and dicyclopentadiene as a base resin. Copolymerization with dicyclopentadiene was under study to develop higher transparency novolac resins. JP-A 10-282666 proposes a curable resin in the form of a resol-dicyclopentadiene copolycondensed polymer having pendant glycidyl groups. Further, JP-A 6-80760 and JP-A 7-5302 propose a resist composition comprising naphthol condensed with aldehyde.

SUMMARY OF THE INVENTION

An object of the invention is to provide a material to form an undercoat in the silicon-containing bilayer resist process which functions effectively as an antireflective film, has higher transparency than polyhydroxystyrene, cresol novolac and naphthol novolac resins, have optimum n and k values, and improved etching resistance during substrate processing; and a resist pattern-forming process using the same.

We have found that a copolycondensate of a naphthol derivative with dicyclopentadiene has optimum n and k values at 193 nm and improved etching resistance and is thus a useful material for forming an undercoat layer in the silicon-containing bilayer resist process.

Specifically, the present invention provides a material based on a copolycondensation novolac resin of a naphthol derivative with dicyclopentadiene, which material is suitable for forming a novel undercoat layer applicable in the silicon-containing bilayer resist process, exerts an improved antireflection effect at a wavelength of 193 nm and a film thickness of at least 200 nm, and has improved etching resistance. On account of a combination of optimum n and k values, the material is effective for suppressing substrate reflection at a film thickness of at least 200 nm, and highly resistant to etching under substrate etching conditions.

In one aspect, the invention provides a patterning process comprising the steps of applying an undercoat layer comprising a copolycondensate of a naphthol derivative with dicyclopentadiene on a processable substrate as an antireflective film; applying a layer of a photoresist composition over the undercoat layer; exposing the photoresist layer in a pattern circuit region to radiation; developing the photoresist layer with a developer to form a resist pattern; and processing the undercoat layer and the substrate through the photoresist layer as a mask, by means of a dry etching apparatus.

In one preferred embodiment, the photoresist composition comprises a silicon atom-containing polymer, and the processing step includes dry etching the undercoat layer through the photoresist layer serving as a mask with an oxygen-based etching gas. Preferably, the processing step further includes, after the oxygen gas etching of the undercoat layer, dry etching the substrate through the undercoat layer serving as a mask.

In another aspect, the invention provides an undercoat-forming material for use in the above patterning process, comprising a copolycondensate of a naphthol derivative with dicyclopentadiene which has the general formula (1) or (2) and optionally, an organic solvent, a crosslinker, and an acid generator.

Herein $R^1$ to $R^8$ are each independently a hydrogen atom, hydroxyl group, substituted or unsubstituted $C_1$-$C_6$ alkyl group, substituted or unsubstituted $C_1$-$C_6$ alkoxy group, substituted or unsubstituted $C_2$-$C_6$ alkoxycarboxyl, substituted or unsubstituted $C_6$-$C_{10}$ aryl group, $C_1$-$C_6$ hydroxyalkyl group, isocyanate group or glycidyl ether group, m and n are positive integers.

DESCRIPTION OF THE PREFERRED EMBODIMENTS

The patterning process of the invention involves the steps of applying an undercoat layer comprising a copolycondensate of a naphthol derivative with dicyclopentadiene on a substrate as an antireflective film, applying a layer of a photoresist composition over the undercoat film, exposing the photoresist layer in a pattern circuit region to radiation, developing the photoresist layer with a developer to form a resist pattern, and processing the undercoat layer and the substrate through the photoresist layer as a mask, by means of a dry etching apparatus.

The material for forming the undercoat layer essentially contains (A) a copolycondensate of a naphthol derivative with dicyclopentadiene as a base polymer. Preferably, the material further contains (B) an organic solvent, (C) a crosslinking agent, and (D) an acid generator.

The copolycondensate of a naphthol derivative with dicyclopentadiene preferably has the general formula (1) or (2).

Herein $R^1$ to $R^8$ are each independently a hydrogen atom, hydroxyl group, substituted or unsubstituted $C_1$-$C_6$ alkyl group, substituted or unsubstituted $C_1$-$C_6$ alkoxy group, substituted or unsubstituted $C_2$-$C_6$ alkoxycarboxyl, substituted or unsubstituted $C_6$-$C_{10}$ aryl group, $C_1$-$C_6$ hydroxyalkyl group, isocyanate group or glycidyl ether group, m and n are positive integers.

Examples of the naphthol derivative from which the recurring units of formulae (1) and (2) are derived include 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene and 2,6-dihydroxynaphthalene, and methyl 3-hydroxy-naphthalene-2-carboxylate. Dicyclopentadiene is a dimer of cyclopentadiene and includes two isomers of endo and exo forms. The dicyclopentadiene used as the reactant to the resin in the practice of the invention may be either of isomers or a mixture of two isomers. When a mixture of two isomers is used, the ratio of isomers is not critical.

The recurring units of formulae (1) and (2) are obtainable by addition reaction of dicyclopentadiene to a naphthol in the presence of an acid catalyst. Examples of the acid catalyst used herein include Lewis acids such as boron trifluoride-ethanol complex and aluminum chloride; mineral acids such as hydrochloric acid, nitric acid and sulfuric acid; sulfonic acids such as methanesulfonic acid, n-butanesulfonic acid, benzenesulfonic acid, p-toluenesulfonic acid, m-xylenesulfonic acid, p-xylenesulfonic acid, and mesitylenesulfonic acid; super-strong acids like perfluorosulfonic acids such as trifluoromethanesulfonic acid, nonafluoromethanesulfonic acid, and pentafluorobenzenesulfonic acid; perfluoroalkyl polymers having terminal sulfonic acid groups such as Nafion® (Dupont), and anion exchange resins such as polystyrene having sulfonic residues. Of these, methanesulfonic acid, tosylic acid, and trifluoromethanesulfonic acid are preferred. For example, the amount of methanesulfonic acid used is typically 0.01 to 10% by weight, preferably 0.05 to 5% by weight based on the reactants. The amount of trifluoromethanesulfonic acid used is typically 0.0001 to 5% by weight, preferably 0.0005 to 1% by weight based on the reactants.

The naphthol derivative is combined with dicyclopentadiene in such a proportion as to provide 0.1 to 2.0 mol, preferably 0.2 to 1.8 mol of dicyclopentadiene per mol of naphthol derivative.

While the invention is characterized by applying a polymer obtained by copolycondensation of naphthol derivative with dicyclopentadiene as an undercoat layer, it is possible to further incorporate a phenol in the copolycondensation. Examples of suitable phenols include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol. Other suitable monomers which can be copolycondensed with naphthol include indene, hydroxyanthracene, acenaphthylene and biphenyl. Copolymers of three or more monomers including such an additional monomer or monomers are acceptable.

It is noted that the proportion of phenol units copolycondensed is preferably up to 60 mol %, especially 0 to 50 mol % based on the base polymer comprising a copolycondensate of a naphthol derivative with dicyclopentadiene.

The reaction includes a first stage of effecting addition reaction of dicyclopentadiene to a hydroxyl group on naphthol to form an ether, and a second stage of effecting transition reaction of the ether to form a naphthol resin. The reaction temperature is in a range of 20 to 200° C., preferably 40 to 160° C. After the completion of reaction, a naphthol-dicyclopentadiene resin is recovered by distilling off the unreacted naphthol derivative by any desired technique. Desirably this is followed by a cleaning step for the effective use of the reaction product for the purpose of the invention. The cleaning step may be carried out by any desired method. Exemplary cleaning methods include the addition of an alkali metal hydroxide whereby a component that forms an alkali metal salt which is water insoluble is removed; the washing of the reaction product with water along with organic solvents (for example, aromatic hydrocarbons such as toluene and xylene, ketones such as methyl ethyl ketone and methyl isobutyl ketone, and higher alcohols such as amyl alcohol, isoamyl alcohol, heptanol, 2-heptanol, octanol and isooctanol); the washing of the reaction product with dilute hydrochloric acid along with the foregoing organic solvents; and the treatment of the reaction product with adsorbents such as silica gel, alumina and activated carbon using solvents such as 1,2-dichloroethane, chloroform, methyl cellosolve, ethyl cellosolve, dimethylformamide and dimethylacetamide. The gel and acidic components and impurities such as metal ions are desirably minimized by any of these cleaning methods or a combination thereof.

Preferably the naphthol-dicyclopentadiene resin has a weight average molecular weight in the range of 1,500 to 200,000, more preferably 2,000 to 10,000. The molecular weight distribution or dispersity is not critical. If desired, lower and higher molecular weight fractions can be removed by fractionation for reducing the dispersity. It is acceptable to use a mixture of two or more naphthol-dicyclopentadiene resins having different molecular weights or dispersities or a mixture of two or more naphthol-dicyclopentadiene resins having different compositional ratios.

If desired, the inventive naphthol-dicyclopentadiene copolymerized resin can be hydrogenated to further improve its transparency. The degree of hydrogenation is preferably up to 50 mol % of the aromatic groups on naphthol and other components if any.

The base resin of the undercoat-forming material of the invention is characterized by the inclusion of the naphthol-dicyclopentadiene resin although the resin can be blended with any of conventional polymers which are used in the art as the antireflective film-forming material. The naphthol-dicyclopentadiene resin has a glass transition temperature (Tg) of at least 150° C., and when used alone, is sometimes ineffective in filling deep holes such as via holes. One effective approach of filling holes with a resin without leaving voids is by using a polymer having a low Tg, heating the polymer at a temperature below the crosslinking temperature to provide a heat flow, and filling holes to the bottom (see U.S. Pat. No. 6,316,165 or JP-A 2000-294504). The naphthol-dicyclopentadiene resin may be blended with polymers having a low Tg, typically a Tg below 180° C., especially a Tg of 100 to 170° C., for example, acrylic derivatives, vinyl alcohol, vinyl ethers, allyl ethers, styrene derivatives, allyl benzene derivatives, olefins such as ethylene, propylene and butadiene, and polymers obtained by metathesis ring-opening polymerization, to form a blend having a lower Tg and improved via hole filling performance. The blending proportion of the naphthol derivative-dicyclopentadiene copolycondensate to a polymer with a low Tg is preferably between 1:0.1 and 1:10, especially between 1:0.2 and 1:5, in weight ratio.

Another Tg lowering method is to substitute straight, branched or cyclic $C_1$-$C_{20}$ alkyl groups, acid labile groups (e.g., t-butyl, t-amyl, acetal), acetyl or pivaloyl groups for hydrogen atoms of hydroxyl groups on the naphthol-dicyclopentadiene novolac resin. The degree of substitution is preferably in a range of 10 to 60 mol %, more preferably 15 to 50 mol % based on the hydroxyl groups on the naphthol-dicyclopentadiene novolac resin.

One of the functions required for the undercoat layer including an antireflective film is the elimination of intermixing with the resist and the elimination of diffusion of low molecular weight components into the resist layer (see Proc. SPIE Vol. 2195, pp. 225-229 (1994)). One common means for preventing intermixing and diffusion is by baking an antireflective film as spin coated for inducing thermal crosslinkage. Then, in the event the antireflective film material contains a crosslinker, a method of introducing crosslinkable substituent groups into the polymer may be employed.

Examples of the crosslinker (C) which can be used herein include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Where hydrogen atoms of hydroxyl groups on the naphthol-dicyclopentadiene resin of formula (1) or (2) are substituted with glycidyl groups, the addition of a compound having a hydroxyl group is effective. Compounds having at least two hydroxyl groups in a molecule are more preferred. Examples include alcoholic group-containing compounds such as naphthol novolac, m- and p-cresol novolac, naphthol-dicyclopentadiene novolac, m- and p-cresol-dicyclopentadiene novolac, 4,8-bis(hydroxymethyl)tricyclo[5.2.1.0$^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy; and low-nuclear phenol compounds such as bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4"-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4"-ethylidyne tris[2-methylphenol], 4,4',4"-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4",4"'-(1,2-ethanediylidene)tetrakisphenol, 4,4',4",4"'-(1,2-ethanediylidene)tetrakis[2-methylphenol], 2,2'-methylenebis[6-[(2-hydroxy-5-methylphenyl)methyl]-4-methylphenol], 4,4',4",4"'-(1,4-phenylenedimethylidyne) tetrakisphenol, 2,4,6-tris(4-hydroxyphenylmethyl)-1,3-benzenediol, 2,4',4"-methylidenetrisphenol, 4,4',4"'-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol, 2,2'-methylenebis[6-[(3,5-dimethyl-4-hydroxyphenyl)methyl]-4-methylphenol, 4,4',4",4"'-tetrakis[(1-methylethylidene)bis(1,4-cyclohexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

In the inventive undercoat-forming material, the crosslinker is preferably compounded in an amount of 5 to 50 parts by weight, more preferably 10 to 40 parts by weight per 100 parts by weight of the base polymer (entire resin). Less than 5 pbw of the crosslinker may allow for mixing with the resist. More than 50 pbw of the crosslinker may degrade the antireflection effect or allow the crosslinked film to crack.

In the practice of the invention, (D) an acid generator may be added to accelerate the thermally induced crosslinking reaction. Acid generators include those which generate an acid through pyrolysis and those which generate an acid upon exposure to light, and both are useful.

The photoacid generators (D) used herein include
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4), (v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1a-3):

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzene-sulfonate, and alkylsulfonate ions such as mesylate and butanesulfonate.

The salts of (P1a-1) and (P1a-2) have both the functions of a photoacid generator and a thermal acid generator while the salts of (P1a-3) function as a thermal acid generator.

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

Herein, $R^{101a}$ and $R^{101b}$ are as defined above.

(v) Sulfonic acid esters of N-hydroxyimide Compounds of Formula (P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
tetra-n-butylammonium nonafluorobutanesulfonate,
tetraphenylammonium nonafluorobutanesulfonate,
tetramethylammonium p-toluenesulfonate,
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
nitrobenzyl sulfonate derivatives such as
2,6-dinitrobenzyl p-toluenesulfonate and 2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethane-sulfonate, and
N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethane-sulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethane-sulfonate, (2-norbornyl)methyl(2-oxocylohexyl)sulfonium trifluoro-methanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combinations of two or more thereof.

The acid generator is preferably added in an amount of 0.1 to 50 parts by weight, and especially 0.5 to 40 parts by weight, per 100 parts by weight of the base polymer. Less than 0.1 pbw of the acid generator generates an insufficient amount of acid to induce crosslinking reaction whereas more than 50 pbw of the acid generator may invite a mixing phenomenon that the acid migrates into the overlaying resist.

In the undercoat-forming material of the invention, a basic compound may be compounded for improving the storage stability. The basic compound plays the role of an acid quencher for preventing a small amount of acid generated from the acid generator from promoting the crosslinking reaction.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.001 to 2 parts by weight, and especially 0.01 to 1 part by weight, per 100 parts by weight of the entire base polymer. Less than 0.001 pbw of the basic compound may fail to provide the desired effect whereas more than 2 pbw of the basic compound may trap the entirety of thermally generated acid to inhibit crosslinking reaction.

The organic solvent used in the undercoat-forming material of the invention may be any organic solvent in which the base polymer, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate and propylene glycol monomethyl ether acetate, and mixtures thereof.

The organic solvent is preferably added in an amount of about 500 to 10,000 parts by weight, especially about 1,000 to 5,000 parts by weight per 100 parts by weight of the entire base polymer.

Like photoresists, the undercoat-forming material of the invention can be applied onto a processable substrate by any desired technique such as spin coating, to form an undercoat layer thereon. After spin coating, the coating is desirably baked in order to evaporate off the solvent and to promote crosslinking reaction for preventing the undercoat layer from mixing with the overlaying resist. The baking is preferably effected at a temperature of 80 to 300° C. for a time of 10 to 300 seconds. The thickness of the undercoat layer may be suitably determined although it is preferably in the range of 100 to 20,000 nm, especially 150 to 15,000 nm. Once the undercoat layer is formed, a resist layer is formed thereon.

Any of well-known photoresist compositions may be used to form the resist layer. From the standpoint of oxygen gas etching resistance, use is often made of a positive photoresist composition comprising a silicon atom-containing polymer such as a polysilsesquioxane derivative or vinylsilane derivative as a base polymer, an organic solvent, a photoacid generator, and optionally, a basic compound or the like. As the silicon atom-containing polymer, any of well-known polymers which are used in resist compositions of this type may be used.

When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired circuit pattern, post-exposure baked (PEB) and developed with a liquid developer, obtaining a resist pattern. The thickness of the resist layer is preferably in a range of 30 to 500 nm, more preferably 50 to 400 nm, though not critical.

Next, using the resist pattern as a mask, the undercoat layer is etched with an oxygen-base gas. This etching can be carried out by an ordinary method. In addition to oxygen gas, an inert gas such as He or Ar or another gas such as CO, $CO_2$, $NH_3$, $SO_2$, $N_2$ or $NO_2$ may be added to the etching gas. The other gas is used for sidewall protection, that is, for preventing the pattern sidewalls from being undercut.

Next, the processable substrate is etched by a conventional technique. For example, when the substrate is $SiO_2$ or SiN, etching with a fluorocarbon-base gas is employed. When the substrate is p-Si, Al or W, etching with a chlorine or bromine-base gas is employed. The undercoat layer of the invention is resistant to the etching of the substrate with any of such gases.

The processable substrate is formed on a support substrate. The support substrate includes those of Si, α-Si, p-Si, $SiO_2$, SiN, SiON, W, TiN, Al and the like, and a suitable material different from the processable film (or processable substrate) is selected among them. The processable film is selected from low-k films of Si, $SiO_2$, SiON, SiN, p-Si, α-Si, W, W—Si, Al, Cu, Al—Si and the like and stop films thereof, and typically has a thickness of 50 to 10,000 nm, especially 100 to 5,000 nm.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, Mw for weight average molecular weight, and Mn for number average molecular weight.

Synthesis Example 1

A 300-ml flask was charged with 144 g (1 mol) of 1-naphthol and 0.01 g of trifluoromethanesulfonic acid. With stirring at 50° C., 132 g (1 mol) of dicyclopentadiene was added dropwise over one hour. The solution was stirred at the temperature for one hour, heated to 150° C. and stirred for 2 hours, completing reaction. The unreacted reactants were removed by vacuum distillation. The reaction product was dissolved in 200 g of 1,2-dichloroethane, which was washed with water to remove the catalyst and metal impurities. On vacuum removal of 1,2-dichloroethane, 230 g of Polymer 1 was recovered.

The molecular weight (Mw) and dispersity (Mw/Mn) of Polymer 1 were determined by GPC using polystyrene standards. From $^1$H-NMR analysis, the ratio of naphthol to dicyclopentadiene in the polymer was determined.

Polymer 1: 1-naphthol/dicyclopentadiene molar ratio=0.55:0.45
Mw=4,400
Mw/Mn=3.1

Synthesis Example 2

A 300-ml flask was charged with 144 g (1 mol) of 1-naphthol and 0.007 g of trifluoromethanesulfonic acid. With stirring at 50° C., 66 g (0.5 mol) of dicyclopentadiene was added dropwise over one hour. The solution was stirred at the temperature for one hour, heated to 150° C. and stirred for 2 hours, completing reaction. The unreacted reactants were removed by vacuum distillation. The reaction product was dissolved in 200 g of 1,2-dichloroethane, which was washed with water to remove the catalyst and metal impurities. On vacuum removal of 1,2-dichloroethane, 180 g of Polymer 2 was recovered.

The molecular weight (Mw) and dispersity (Mw/Mn) of Polymer 2 were determined by GPC using polystyrene standards. From $^1$H-NMR analysis, the ratio of naphthol to dicyclopentadiene in the polymer was determined.

Polymer 2: 1-naphthol/dicyclopentadiene molar ratio=0.77:0.23
Mw=5,200
Mw/Mn=2.8

Synthesis Example 3

A 300-ml flask was charged with 174 g (1 mol) of 7-methoxy-1-naphthol and 0.007 g of trifluoromethanesulfonic acid. With stirring at 50° C., 66 g (0.5 mol) of dicyclopentadiene was added dropwise over one hour. The solution was stirred at the temperature for one hour, heated to 150° C. and stirred for 2 hours, completing reaction. The unreacted reactants were removed by vacuum distillation. The reaction product was dissolved in 200 g of 1,2-dichloroethane, which was washed with water to remove the catalyst and metal impurities. On vacuum removal of 1,2-dichloroethane, 221 g of Polymer 3 was recovered.

The molecular weight (Mw) and dispersity (Mw/Mn) of Polymer 3 were determined by GPC. From $^1$H-NMR analysis, the ratio of naphthol to dicyclopentadiene in the polymer was determined.

Polymer 3: 7-methoxy-1-naphthol/dicyclopentadiene molar ratio=0.77:0.23
Mw=3,200
Mw/Mn=2.6

Synthesis Example 4

A 500-ml flask was charged with 100 ml of cyclohexane, in which were dissolved 100 g of the 1-naphthol-dicyclo-pentadiene novolak resin obtained in Synthesis Example 1 and 5 g of tetramethylammonium bromide. To the solution, 38 g of epichlorohydrin was added dropwise, followed by stirring at 80° C. for one hour to addition reaction. Then 8 g of sodium hydroxide was added to the solution whereupon ring-closing reaction was effected at 80° C. for 3 hours, obtaining an epoxy compound. Thereafter, the reaction solution was washed with water to remove the unreacted epichlorohydrin and sodium hydroxide and dried in vacuum to remove ethyl acetate. There was obtained 122 g of a glycidyl-substituted 1-naphthol-dicyclopentadiene novolac resin, designated Polymer 4.

The molecular weight (Mw) and dispersity (Mw/Mn) of Polymer 4 were determined by GPC. From $^1$H-NMR analysis, the ratio of glycidyl-substituted 1-naphthol to dicyclopentadiene in the polymer was determined.

Polymer 4: glycidyl-substituted 1-naphthol/dicyclopentadiene molar ratio=0.55:0.45
  Mw=6,100
  Mw/Mn=3.1

Examples and Comparative Examples

An undercoat-forming material solution was prepared by dissolving a naphthol-dicyclopentadiene polymer (Polymers 1 to 4), acid generator (AG1, AG2), and crosslinker (CR1, CR2) in a solvent containing 0.1 wt % of FC-430 (3M-Sumitomo Co., Ltd.) according to the formulation shown in Table 1, and passing through a fluoroplastic filter having a pore size of 0.1 μm. Comparative Polymer 1 is a m-cresol novolac resin having a Mw of 8,900 and a Mw/Mn of 4.8; Comparative Polymer 2 is a 1-naphthol resin having a Mw of 3,300 and a Mw/Mn of 3.5; and Comparative Polymer 3 is a 30/70 (molar ratio) p-hydroxystyrene-hydroxyethyl acrylate copolymer having a Mw of 33,000 and a Mw/Mn of 1.9.

The undercoat-forming material solution was applied onto a silicon substrate and baked at 200° C. for 60 seconds to form an undercoat layer of 400 nm thick, designated UDL1 to UDL7. Using a variable angle spectroscopic ellipsometer (VASE®) of J. A. Woollam Co., the refractive index (n, k) at wavelength 193 nm of UDL1 to UDL7 was determined. The results are also shown in Table 1.

TABLE 1

| No. | Polymer (pbw) | Crosslinker (pbw) | Acid generator (pbw) | Solvent (pbw) | Refractive index at wavelength 193 nm | |
|---|---|---|---|---|---|---|
| | | | | | n | k |
| UDL1 | Polymer 1 (28.0) | CR1 (10) | AG1 (5) | PGMEA (100) | 1.67 | 0.20 |
| UDL2 | Polymer 2 (28.0) | CR1 (10) | AG1 (5) | PGMEA (100) | 1.61 | 0.25 |
| UDL3 | Polymer 3 (28.0) | CR1 (10) | AG1 (5) | PGMEA (100) | 1.69 | 0.24 |
| UDL4 | Polymer 4 (10.0) Polymer 1 (18.0) | — | AG1 (5) | PGMEA (100) | 1.68 | 0.20 |
| UDL5 | Polymer 1 (18.0) Comparative Polymer 3 (10.0) | CR1 (10) | AG1 (5) | PGMEA (100) | 1.69 | 0.22 |
| UDL6 | Polymer 1 (28.0) | CR2 (10) | AG1 (5) | PGMEA (100) | 1.67 | 0.21 |
| UDL7 | Polymer 1 (28.0) | CR1 (10) | AG2 (5) | PGMEA (100) | 1.67 | 0.19 |
| Comparative Example 1 | Comparative Polymer 1 (25.0) | CR1 (10) | AG1 (5) | PGMEA (100) | 1.32 | 0.62 |
| Comparative Example 2 | Comparative Polymer 2 (28.0) | CR1 (10) | AG1 (5) | PGMEA (100) | 1.40 | 0.33 |
| Comparative Example 3 | Comparative Polymer 3 (22.0) | CR1 (10) | AG1 (5) | PGMEA (100) | 1.70 | 0.25 |

PGMEA: propylene glycol monomethyl ether acetate

AG1

AG2

-continued

CR1

CR2

Separately, the undercoat-forming material solution was applied onto a SiO$_2$ substrate of 300 nm thick and baked at 200° C. for 60 seconds to form an undercoat layer of 400 nm thick, designated UDL1 to UDL7. A solution of ArF exposure silicon-containing polymer resist was prepared by dissolving a silicon-containing polymer 1 or 2, photoacid generator PAG1, and base additive AACN in a solvent in accordance with the formulation shown in Table 2. The resist solution was applied over the undercoat layer UDL1 to UDL7, and baked at 110° C. for 60 seconds to form a silicon-containing polymer resist layer of 200 nm thick. Next, the resist layer was exposed using an ArF laser stepper S305B (Nikon Corporation, NA 0.68, σ 0.85, ⅔ annular illumination, Cr mask), then baked (PEB) at 110° C. for 90 seconds, and developed with a 2.38 wt % aqueous solution of tetramethylammonium hydroxide (TMAH), thereby giving a positive pattern. The shape of the 0.10 μm line-and-space pattern was observed, finding none of footing, undercutting, and intermixing phenomena in proximity to the substrate. That is, rectangular pattern definition was confirmed.

TABLE 2

| No. | Polymer (pbw) | Photoacid generator (pbw) | Base (pbw) | Solvent (pbw) |
|---|---|---|---|---|
| Resist 1 | Si-containing polymer 1 (100) | PAG1 (2.2) | AACN (0.3) | PGMEA (1200) |
| Resist 2 | Si-containing polymer 2 (100) | PAG1 (2.2) | AACN (0.3) | PGMEA (800) |

( Silicon-containing polymer 1 adapted for ArF exposure )

a = 0.40, b = 0.50, c = 0.1 Mw = 8,800)

TABLE 2-continued

| No. | Polymer (pbw) | Photoacid generator (pbw) | Base (pbw) | Solvent (pbw) |
|---|---|---|---|---|

(Silicon-containing polymer 2 adapted for ArF exposure)

(d = 0.30, e = 0.70 Mw = 2,500)

PAG1

AACN

Next, a dry etching test was conducted. There were prepared undercoat layers (UDL1 to UDL7) as used for the measurement of refractive index. These undercoat layers were examined by a test (1) of etching with CHF$_3$/CF$_4$ gas using a dry etching instrument TE-8500P by Tokyo Electron K.K. A difference in thickness of the undercoat layer before and after the etching test was determined. The results are shown in Table 4.

(1) CHF$_3$/CF$_4$ Gas Etching Test

| | |
|---|---|
| Chamber pressure | 40.0 Pa |
| RF power | 1300 W |
| Gap | 9 mm |
| CHF$_3$ gas flow rate | 30 ml/min |
| CF$_4$ gas flow rate | 30 ml/min |
| Ar gas flow rate | 100 ml/min |
| Time | 60 sec |

The undercoat layers (UDL1 to UDL7) were further examined by a test (2) of etching with Cl$_2$/BCl$_3$ gas using a dry etching instrument L-507D-L by Nichiden Anerba K. K. A difference in thickness of the polymer layer before and after the etching test was determined. The results are shown in Table 5.

(2) Cl$_2$/BCl$_3$ Gas Etching Test

| | |
|---|---|
| Chamber pressure | 40.0 Pa |
| RF power | 300 W |
| Gap | 9 mm |
| Cl$_2$ gas flow rate | 30 ml/min |
| BCl$_3$ gas flow rate | 30 ml/min |
| CHF$_3$ gas flow rate | 100 ml/min |
| O$_2$ gas flow rate | 2 ml/min |
| Time | 60 sec |

Additionally, through the silicon-containing polymer resist of 0.10 μm line-and-space pattern resulting from ArF exposure and development, the undercoat layer was etched with oxygen gas under the following conditions.

Oxygen Etching

| | |
|---|---|
| Chamber pressure | 450 mTorr |
| RF power | 600 W |
| Gap | 9 mm |
| Ar gas flow rate | 40 sccm |
| O$_2$ gas flow rate | 60 sccm |
| Time | 20 sec |

Thereafter, the SiO$_2$ substrate was processed by etching with CHF$_3$/CF$_4$ gas under test conditions (1).

After the development of the resist, oxygen gas etching of the undercoat, and CHF$_3$/CF$_4$ gas etching of the substrate, respectively, the cross section of the pattern was observed under an electron microscope S-4700 (Hitachi Ltd.). The results are shown in Table 3. Specifically, after the development, the cross-sectional shape of the silicon-containing polymer resist was observed. After the oxygen etching and CHF$_3$/CF$_4$ gas etching, the cross-sectional shape of the undercoat layer was observed.

TABLE 3

| No. | Pattern shape after development | Shape after oxygen gas etching | Shape after CF$_4$/CHF$_3$ gas etching |
|---|---|---|---|
| UDL1 | perpendicular | perpendicular | perpendicular |
| UDL2 | perpendicular | perpendicular | perpendicular |
| UDL3 | perpendicular | perpendicular | perpendicular |
| UDL4 | perpendicular | perpendicular | perpendicular |
| UDL5 | perpendicular | perpendicular | perpendicular |
| UDL6 | perpendicular | perpendicular | perpendicular |
| UDL7 | perpendicular | perpendicular | perpendicular |
| Comparative Example 1 | pattern collapse | — | — |
| Comparative Example 2 | undercut, sidewall roughened by standing waves | tapered | tapered |
| Comparative Example 3 | perpendicular | perpendicular | tapered and slimmed |

TABLE 4

| Antireflective film or Resist No. | Etching rate with CHF$_3$/CF$_4$ gas (nm/min) |
|---|---|
| UDL1 | 92 |
| UDL2 | 95 |
| UDL3 | 99 |
| UDL4 | 90 |
| UDL5 | 103 |
| UDL6 | 92 |
| UDL7 | 93 |
| Comparative Example 1 | 98 |
| Comparative Example 2 | 95 |
| Comparative Example 3 | 144 |

TABLE 5

| Antireflective film or Resist No. | Etching rate with Cl$_2$/BCl$_3$ gas (nm/min) |
|---|---|
| UDL1 | 118 |
| UDL2 | 120 |
| UDL3 | 122 |
| UDL4 | 123 |
| UDL5 | 126 |
| UDL6 | 110 |
| UDL7 | 133 |
| Comparative Example 1 | 125 |
| Comparative Example 2 | 118 |
| Comparative Example 3 | 166 |

As seen from Table 1, the undercoat layers of the invention have a refractive index with an n value of 1.5 to 1.9 and a k value of 0.15 to 0.3, indicating an optimum refractive index (n) and extinction coefficient (k) to provide a satisfactory antireflection effect at a film thickness of 200 nm or greater. As seen from Tables 4 and 5, the etching rates of the undercoat layers with CHF$_3$/CF$_4$ gas and Cl$_2$/BCl$_3$ gas are approximately equal to those of the novolac resin and lower than those of the polyhydroxystyrene/hydroxyethyl acrylate copolymer, indicating that the undercoat layers have high etching resistance. As seen from Table 3, the shape of resist after development is good and the shapes of undercoat layers remain good both after oxygen etching and after substrate etching.

The undercoat-forming material of the invention has a refractive index with an n value in the range of 1.5 to 1.9 and a k value in the range of 0.15 to 0.3, indicating an optimum extinction coefficient to provide a satisfactory antireflection effect at a film thickness of 200 nm or greater. The etching rates of the undercoat layers when etched with CHF$_3$/CF$_4$ gas and Cl$_2$/BCl$_3$ gas as typically used in substrate processing, are approximately equal to those of the novolac resin, indicating high etching resistance. The shape of resist after patterning remains satisfactory.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A patterning process comprising the steps of:
    applying an undercoat layer comprising a copolycondensate of a naphthol derivative with dicyclopentadiene on a processable substrate as an antireflective film, said copolycondensate having the general formula (1) or (2):

wherein $R^1$ to $R^8$ are each independently a hydrogen atom, hydroxyl group, substituted or unsubstituted $C_1$-$C_6$ alkyl group, substituted or unsubstituted $C_1$-$C_6$ alkoxy group, substituted or unsubstituted $C_2$-$C_6$ alkoxycarboxyl, substituted or unsubstituted $C_6$-$C_{10}$ aryl group, $C_1$-$C_6$ hydroxyalkyl group, isocyanate group or glycidyl ether group, m and n are positive integers, applying a layer of a photoresist composition over the undercoat layer, exposing the photoresist layer in a pattern circuit region to radiation, developing the photoresist layer with a developer to form a resist pattern, and processing the undercoat layer and the substrate through the photoresist layer as a mask, by means of a dry etching apparatus.

2. The patterning process of claim 1, wherein said photoresist composition comprises a silicon atom-containing polymer, and the processing step includes dry etching the undercoat layer through the photoresist layer as a mask with an oxygen-based etching gas.

3. The patterning process of claim 2, wherein the processing step further includes, after the oxygen gas etching of the undercoat layer, dry etching the substrate through the undercoat layer as a mask.

4. An undercoat-forming material for use in the patterning process of any one of claims 1 to 3, comprising a copolycondensate of a naphthol derivative with dicyclopentadiene which has the general formula (1) or (2):

wherein $R^1$ to $R^8$ are each independently a hydrogen atom, hydroxyl group, substituted or unsubstituted $C_1$-$C_6$ alkyl group, substituted or unsubstituted $C_1$-$C_6$ alkoxy group, substituted or unsubstituted $C_1$-$C_6$ alkoxycarboxyl, substituted or unsubstituted $C_6$-$C_{10}$ aryl group, $C_1$-$C_6$ hydroxyalkyl group, isocyanate group or glycidyl ether group, m and n are positive integers, and a crosslinker selected from the group consisting of melamine compounds, guanamine compounds, glycoluril compounds and urea compounds having substituted thereon at least one group selected from among methylol, alkoxymethyl and acyloxymethyl groups, thioepoxy compounds, isocyanate compounds, azide compounds, and compounds having an alkenyl ether group.

5. The undercoat-forming material of claim 4, further comprising an organic solvent, and an acid generator.

* * * * *